United States Patent
Wang et al.

(10) Patent No.: US 12,184,227 B2
(45) Date of Patent: Dec. 31, 2024

(54) HALF-CELL ASSEMBLY

(71) Applicant: TONGWEI SOLAR (HEFEI) CO., LTD., Hefei (CN)

(72) Inventors: Lingxiang Wang, Hefei (CN); Linlin Gui, Hefei (CN); Jie Song, Hefei (CN); Dongsheng Li, Hefei (CN); Fushen Zhou, Hefei (CN); Yan Li, Hefei (CN)

(73) Assignee: TONGWEI SOLAR (HEFEI) CO., LTD., Hefei (CN)

( * ) Notice: Subject to any disclaimer, the term of this patent is extended or adjusted under 35 U.S.C. 154(b) by 0 days.

(21) Appl. No.: 18/255,033

(22) PCT Filed: Jan. 29, 2022

(86) PCT No.: PCT/CN2022/075106
§ 371 (c)(1),
(2) Date: May 30, 2023

(87) PCT Pub. No.: WO2022/242233
PCT Pub. Date: Nov. 24, 2022

(65) Prior Publication Data
US 2024/0056023 A1    Feb. 15, 2024

(30) Foreign Application Priority Data
May 19, 2021    (CN) .......................... 202110555987.3

(51) Int. Cl.
*H02S 40/34*    (2014.01)
*H01L 31/05*    (2014.01)
(Continued)

(52) U.S. Cl.
CPC .......... *H02S 40/34* (2014.12); *H01L 31/0504* (2013.01); *G05F 1/67* (2013.01);
(Continued)

(58) Field of Classification Search
CPC ... H02S 40/34; H01L 31/0504; H01L 31/042; H01L 31/05; Y02E 10/50; G05F 1/67; G05F 5/00; H02J 1/108
See application file for complete search history.

(56) References Cited

U.S. PATENT DOCUMENTS

| | | | | |
|---|---|---|---|---|
| 2015/0280641 A1* | 10/2015 | Garg | ........................ | H02S 40/32 136/244 |
| 2016/0043693 A1* | 2/2016 | Son | .......................... | H02S 40/34 307/139 |

FOREIGN PATENT DOCUMENTS

| | | |
|---|---|---|
| CA | 2948560 A1 | 4/2018 |
| CN | 104835874 A | 8/2015 |

(Continued)

OTHER PUBLICATIONS

International Search Report (with English translation) for Application No. PCT/US2022/075106, mailed on Apr. 2, 2022, 5 pages.

*Primary Examiner* — Michael Y Sun
(74) *Attorney, Agent, or Firm* — Dority & Manning, P.A.

(57) ABSTRACT

A half-cell assembly includes an integrated junction box and multiple cell string sets connected in series sequentially. Each cell string set includes multiple cell strings connected in parallel, and each cell string includes multiple half-cells connected in series sequentially. The multiple cell string sets are arranged along a first preset direction. In each cell string set, the multiple cell strings are arranged along the first preset direction. In each cell string, the multiple half-cells are arranged along a second preset direction. One of the first preset direction and the second preset direction is the long side direction of the half-cell, and the other is the short side direction of the half-cell. The integrated junction box and the multiple cell string sets are arranged along the second preset direction. The multiple cell string sets are connected in parallel with diodes of the integrated junction box.

14 Claims, 3 Drawing Sheets

(51) Int. Cl.
  *G05F 1/67* (2006.01)
  *G05F 5/00* (2006.01)
  *H02J 1/10* (2006.01)
(52) U.S. Cl.
  CPC ............... *G05F 5/00* (2013.01); *H01L 31/05* (2013.01); *H02J 1/108* (2013.01)

(56) References Cited

FOREIGN PATENT DOCUMENTS

| | | | |
|---|---|---|---|
| CN | 105489676 A | | 4/2016 |
| CN | 112234111 A | * | 1/2021 |
| CN | 212518907 U | | 2/2021 |
| CN | 213026153 U | | 4/2021 |
| CN | 113161440 A | | 7/2021 |
| JP | 2020025086 A | | 2/2020 |

* cited by examiner

HALF-CELL ASSEMBLY

CROSS-REFERENCE TO RELATED DISCLOSURES

The present application is a national stage application of PCT international application No. PCT/CN2022/075106 filed on Jan. 29, 2022, which claims priority to Chinese patent application No. 202110555987.3 filed with the Chinese Patent Office on May 19, 2021, entitled "HALF-CELL ASSEMBLY", the entire contents of which are incorporated by reference.

TECHNICAL FIELD

The present disclosure relates to the solar cell technology, and in particular, to a half-cell assembly.

BACKGROUND

With the rapid growth of the number and scale of solar photovoltaic power stations worldwide, various power station fires caused by fires in photovoltaic power station components are common. In order to improve the safety of the power station system and realize the real-time monitoring and optimization of the power station system, most of the intelligent junction boxes on the market are designed in an integrated structure with a disconnection function, a monitoring function, an optimization function, and a maximum power point tracking (MPPT) function.

The half-cell technology for photovoltaic modules can greatly increase the peak power of modules due to the reduction of module loss. At present, photovoltaic modules utilizing the half-cell technology have been mass-produced in some large factories.

SUMMARY

The present disclosure provides a half-cell assembly that uses an integrated junction box to connect with a circuit of a half-cell, which can integrate multiple functions at a lower cost.

The embodiments of the present disclosure are implemented as follows.

Some embodiments of the present disclosure provide a half-cell assembly which may include an integrated junction box and multiple cell string sets connected in series sequentially. Each cell string set includes multiple cell strings connected in parallel, and each cell string includes multiple half-cells connected in series sequentially. The multiple cell string sets are arranged along a first preset direction. In each cell string set, the multiple cell strings are arranged along the first preset direction. In each cell string, the multiple half-cells are arranged along a second preset direction. One of the first preset direction and the second preset direction is a long side direction of the half-cell, and the other is a short side direction of the half-cell. The integrated junction box and the multiple cell string sets are arranged along the second preset direction, and the multiple cell string sets are connected in parallel with diodes of the integrated junction box.

In some embodiments, the first preset direction and the second preset direction are perpendicular to each other.

In some embodiments, a quantity of the diodes in the integrated junction box is M, and M is an integer greater than or equal to 3. The M diodes are arranged along the first preset direction. The multiple cell string sets are divided into M cell string units in a series connection direction of the multiple cell string sets. The M diodes and the M cell string units are in sequential one-to-one correspondence in the series connection direction, and each of the cell string units is sequentially connected in parallel with one of the diodes.

In some embodiments, a quantity of the diodes in the integrated junction box may be 3.

In some embodiments, each diode comprises an anode terminal and a cathode terminal, and two ends of the corresponding cell string unit are respectively connected to the anode terminal and the cathode terminal, so as to achieve a parallel connection with the diode.

In some embodiments, a quantity of the cell string sets in each cell string unit is even, and/or a quantity of the cell string sets is the same in different cell string units.

In some embodiments, the second preset direction is the long side direction of the half-cell, and the long side direction of the half-cell is parallel to an extension direction of busbars of the half-cell.

In some embodiments, a quantity of the busbars in each half-cell is 2 to 6.

In some embodiments, in each cell string, a quantity of the half-cells is 10 or 12.

In some embodiments, in each cell string set, a quantity of the cell strings is 2

In some embodiments, in the half-cell assembly, a quantity of the cell string sets is 6.

In some embodiments, the half-cell is a crystalline silicon cell.

In some embodiments, the half-cell is a P-type polycrystalline silicon cell, a P-type monocrystalline silicon cell, an N-type polycrystalline silicon cell, or an N-type monocrystalline silicon cell; or the half-cell is a high-efficiency Passivated Emitter and Rear Cell, an N-type cell, a Heterojunction with Intrinsic Thin-Layer cell, or a Multi Busbar cell.

In some embodiments, the integrated junction box further comprises a power supply module, a sampling module, a control module, a driving module, a control switch, and a switching diode.

In some embodiments, the diode, the power supply module and the sampling module are connected in parallel. The diode, the power supply module and the sampling module are connected with the control switch and the sampling module in series, respectively. An input end of the control module is electrically connected to the sampling module, an output end of the control module is electrically connected to the driving module, and the driving module is electrically connected to the control switch, so that the control module is capable of controlling the driving module to turn on and turn off the control switch according to signals from the sampling module.

BRIEF DESCRIPTION OF THE DRAWINGS

In order to illustrate the technical solutions of the embodiments of the present disclosure more clearly, the following briefly describes the accompanying drawings required for describing the embodiments of the present disclosure. It should be understood that the accompanying drawings show merely some embodiments of the present disclosure and therefore should not be considered as limiting the scope. Those of ordinary skill in the art may derive other relevant drawings from these accompanying drawings without creative efforts.

DETAILED DESCRIPTION OF THE EMBODIMENTS

In order to make the purpose, technical solutions, and advantages of the embodiments of the present disclosure more clear, the following further describes the technical solutions of the embodiments of the present disclosure clearly and completely with reference to the accompanying drawings in the embodiments of the present disclosure. Obviously, the described embodiments are merely a part of the embodiments of the present disclosure, but not all of them. The components described and demonstrated in the accompanying drawings of the embodiments of the present disclosure can be arranged and designed in various configurations.

Therefore, the detailed descriptions of the embodiments of the present disclosure provided in the accompanying drawings are not intended to limit the scope of the present disclosure to be protected, but only represents the selected embodiments of the present disclosure. All other embodiments obtained, based on the embodiments in the present disclosure, by a person of ordinary skill in the art without creative effort fall within the protection scope of the present disclosure.

It should be noted that similar symbols and letters in the following drawings represent similar items. Therefore, once an item is defined in one drawing, it does not need to be further defined or explained in subsequent drawings.

It should be noted that, in the description of the present disclosure, terms such as "first", "second", "third", etc. are only configured to distinguish descriptions and cannot be understood as indicating or implying relative importance. In addition, terms such as "perpendicular" and "parallel" do not mean that the parts are absolutely perpendicular or parallel, but can be slightly inclined.

It should also be noted in the description of the present disclosure that unless otherwise defined and limited, the terms "set", "installation" and "connection" should be interpreted broadly. For example, it may be a fixed connection, a detachable connection, or an integral connection. It may also be a direct connection, or an indirect connection through an intermediate medium. It may also be an interconnection within two components. For those skilled in the art, the specific meanings of these terms in the present disclosure can be understood based on specific situations.

Figure 1:
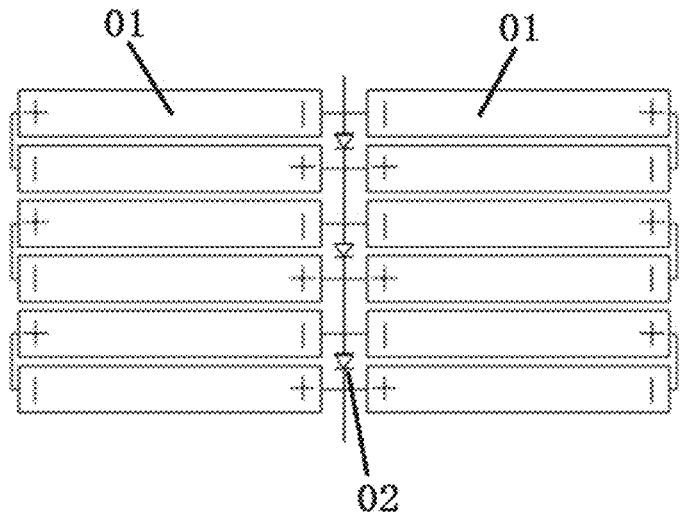
FIG. 1 is a schematic structural diagram of an arrangement of a half-cell assembly according to a related art.

The arrangement of a half-cell assembly known to the inventors is usually as shown in FIG. 1. The circuit of the half-cell assembly includes two half-cell string sub-circuits 01. This arrangement usually requires the junction box to be mounted in the middle position. Due to the limitation of the mounting position, the integrated intelligent junction box cannot be used in current half-cell assemblies, but the split junction boxes 02 are used for connection.

If the split junction box is design in a small specification, few functions can be integrated. If more functions are required to be integrated like the integrated junction box, the cost will be higher.

EMBODIMENTS

Figure 2:
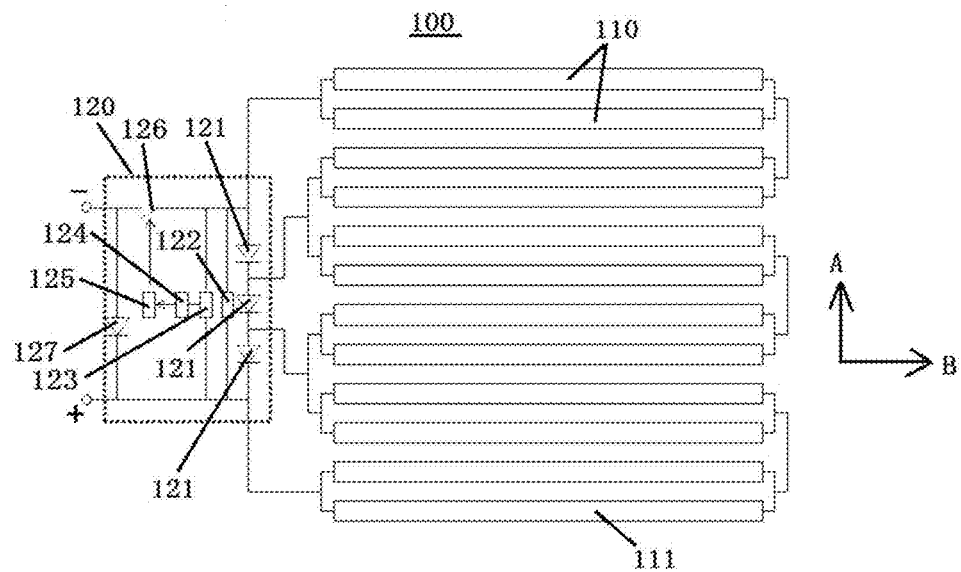
FIG. 2 is a schematic structural diagram of a half-cell assembly according to an embodiment of the present disclosure.
Figure 3:
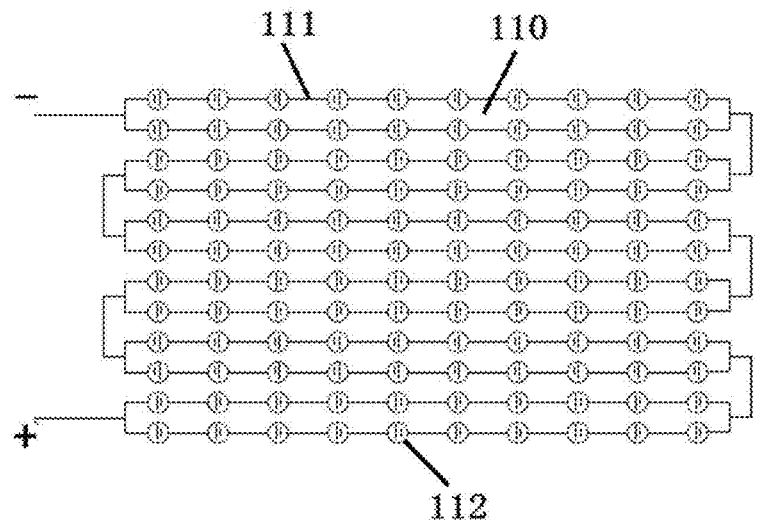
FIG. 3 is an electrical connection structure diagram of a half-cell assembly according to an embodiment of the present disclosure.
Figure 4:
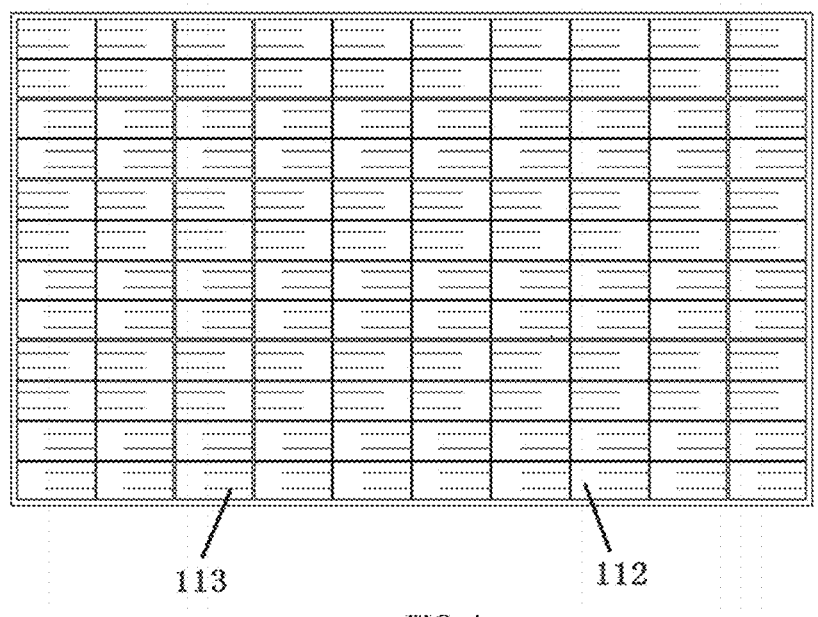
FIG. 4 is a schematic diagram of a cell arrangement of a half-cell assembly according to an embodiment of the present disclosure.

Referring to FIGS. 2 to 4, the present disclosure provides a half-cell assembly 100, which includes an integrated junction box 120 and multiple cell string sets 110 connected in series sequentially.

As shown in FIG. 2, the multiple cell string sets 110 are distributed along a first preset direction A. Each cell string set 110 includes multiple cell strings 111 connected in parallel. In each cell string set 110, the multiple cell strings 111 are arranged along the first preset direction A.

As shown in FIGS. 3 to 4, each cell string 111 includes multiple half-cells 112 connected in series sequentially. Two adjacent half-cells 112 are connected in series with a welding ribbon 113 as a connecting structure, for example. In each cell string 111, the multiple half-cells 112 are arranged along a second preset direction B.

One of the first preset direction A and the second preset direction B is the long side direction of the half-cell 112, and the other is the short side direction of the half-cell 112. As an example, the half-cell 112 has a rectangular structure, and in this case, the first preset direction A is perpendicular to the second preset direction B.

It should be noted that, in the present disclosure, the long side direction of the half-cell 112 refers to the extension direction of the two opposite long sides of the half-cell 112, and the short side direction of the half-cell 112 refers to the extension direction of the two opposite short sides of the half-cell 112.

The multiple cell string sets 110 are connected in series sequentially and arranged along the first preset direction A. The multiple half-cells 112 in each cell string 111 are arranged along the second preset direction B. Therefore, the multiple cell string sets 110 form a half-cell circuit with an S-shaped path (as shown in FIG. 2). In this case, the half-cells 112 in the half-cell assembly 100 are arranged in arrays along the first preset direction A and the second preset direction B (as shown in FIGS. 3 to 4).

In the present disclosure, the integrated junction box 120 and the multiple cell string sets 110 are arranged along the second preset direction B, so that the integrated junction box 120 is located on one side of the circuit with the S-shaped path, facilitating the connection of the multiple cell string sets 110 to the integrated junction box 120, thereby obtaining a structure in which the multiple cell string sets 110 are connected in parallel with the diodes 121 of the integrated junction box 120. The connection of the integrated junction box 120 and the circuit of the half-cell in the half-cell assembly 100 integrates more functions. In addition, compared to a split junction box, the integrated junction box can effectively reduce costs while integrating more functions.

The inventors have also found that, in the specific integrated array arrangement in the half-cell assembly 100, the arrangement of the junction box and the half-cells 112 of the present disclosure is closer to that of the conventional cell assemblies compared to the half-cell technology of the related art shown in FIG. 1, which makes it more compatible with conventional production lines and operators' operations when manufacturing products according to certain specifications.

In addition, the specific series and parallel connections in the half-cell assembly 100 make the test values of the open-circuit voltage, optimum voltage, short-circuit current, and optimum current of the half-cell assembly tested under standard conditions close to or even substantially the same as those of conventional cell assemblies, which indicates that the electrical performance of the half-cell assembly 100 is similar to that of conventional cell assemblies. When applied to the system side, the half-cell assembly 100 has good compatibility with conventional electrical equipment, allowing conventional electrical equipment to be used in conjunction with the cell assembly without modification.

In the embodiments of the present disclosure, the structure of the half-cell assembly 100 can be implemented in a manner known in the art, which includes a panel, packaging materials, cell strings 111, packaging materials, and a back sheet stacked sequentially.

The type of cell is not particularly limited. As an example, the half-cell 112 is a crystalline silicon cell, such as a P-type polycrystalline silicon cell, a P-type monocrystalline silicon cell, an N-type polycrystalline silicon cell, or an N-type monocrystalline silicon cell. In other embodiments, the half-cell 112 may also be, for example, a high-efficiency Passivated Emitter and Rear Cell (PREC) cell, an N-type cell, a Heterojunction with Intrinsic Thin-Layer (HJT) cell, or a Multi Busbar (MBB) cell.

It can be understood that, in the embodiments of the present disclosure, the integrated junction box 120 can be selected according to standards in the art.

As an example of a first aspect, the integrated functional modules of the integrated junction box 120 may optionally further include at least one of a disconnection functional module, a detection functional module, a string optimization functional module, or a maximum power point tracking functional module.

Exemplarily, in addition to the diodes 121, the integrated junction box 120 also includes a power supply module 122, a sampling module 123, a control module 124, a driving module 125, a control switch 126, and a switching diode 127. The diodes 121, the power supply module 122, and the sampling module 123 are connected in parallel, and each is connected with the control switch 126 and the switching diode 127 in series. An input end of the control module 124 is electrically connected to the sampling module 123, an output end of the control module 124 is electrically connected to the driving module 125, and the driving module 125 is electrically connected to the control switch 126, so that the control module 124 can control the driving module 125 to turn on or turn off the control switch 126 according to signals from the sampling module 123.

As an example of a second aspect, the quantity of the diodes 121 in the integrated junction box 120 is M, and M is an integer greater than or equal to 3, so that the diodes 121 in the integrated junction box 120 can better meet the circuit bypass requirements.

It can be understood that, in the embodiments of the present disclosure, the parallel connection of the multiple cell string sets 110 connected in series and the multiple diodes 121 can be implemented in a manner known in the art.

As an example, when the quantity of the diodes 121 is M, the cell string sets 110 are divided into M cell string units in their series connection direction. The M diodes 121 and M cell string units are in sequential one-to-one correspondence in the series direction. For example, if M is equal to three, as shown in FIG. 2, the multiple cell string sets 110 are divided into three units in the series direction, i.e., the first and second cell string sets are taken as a first cell string unit, the third and fourth cell string sets are taken as a second cell string unit, and the fifth and sixth cell string sets are taken as a third cell string unit. A diode 121 at one end is connected in parallel with the cell string unit at this end, the middle diode 121 is connected in parallel with the middle cell string unit, and a diode 121 at the other end is connected in parallel with the cell string unit at the other end. In an embodiment, M diodes 121 are arranged along the first preset direction A so that the arrangement direction of the diodes 121 is the same as that of the cell string units, facilitating the parallel connection of the diodes 121 and the cell string units after sequential one-to-one correspondence. By connecting each cell string unit with one diode in parallel, the diode can act as a bypass when a hot spot phenomenon occurs.

Considering that a large number of diodes 121 will increase the cost of the integrated junction box 120 and also increase the connection cost between the integrated junction box 120 and the cell string units, in some embodiments, the quantity of the diodes 121 in the integrated junction box 120 is three, for example. That is, in the series direction of the multiple cell string sets 110, the multiple cell string sets 110 are also divided into three cell string units. Such a setting facilitates cost control while ensuring a large number of diodes 121 as the bypasses to improve the accuracy of the bypass adjustment of the diodes 121.

A diode 121 usually includes two terminals: an anode terminal and a cathode terminal. Two ends of a cell string unit are respectively connected to the two terminals of the diode 121, so as to achieve a parallel connection with the diode 121. It is convenient for connection when the two ends of the cell string unit are close to the diode 121.

Therefore, as an example, in each cell string unit, the quantity of cell string sets 110 is even, which ensures that the first and last ends of each cell string unit are located on the same side, making it convenient to connect to the integrated junction box 120.

Further, the quantity of cell string sets 110 is the same in different cell string units, which ensures that each diode 121 corresponds to the same quantity of cell string sets 110, which in turn provides good consistency in the bypass adjustment of the diodes 121 as the bypass structure.

As an example, each cell string 111 includes ten or twelve half-cells 112. Each cell string set 110 includes two cell strings 111. The half-cell assembly 100 includes six cell string sets 110.

Accordingly, as shown in FIG. 2, when the quantity of the diodes 121 is three, the six cell string sets 110 are divided into three cell string units. Each cell string unit includes two cell string sets 110 connected in series. Each cell string set 110 includes two cell strings 111 connected in parallel.

The quantity of the half-cells 112 in the cell strings 111, the quantity of the cell strings 111 in the cell string sets 110, and the quantity of the cell string sets 110 are configured according to the above-mentioned specific standards, so that the arrangement of the half-cell assembly 100 is similar to that of a conventional cell assembly with 60 entire cells and a conventional cell assembly with 72 entire cells, and the test values of the open-circuit voltage, optimum voltage, short-circuit current, and optimum current of the half-cell assembly 100 under standard conditions are close to or even substantially the same as those of conventional cell assemblies. The half-cell assembly can better match conventional electrical equipment. When the half-cell assembly 100 is applied to the system side, there is no need to replace the electrical equipment that accompanies the half-cell assembly 100.

It can be understood that, in the embodiments of the present disclosure, the half-cell 112 in the cell string 111 may be selected from conventional structures in the art.

Figure 5:
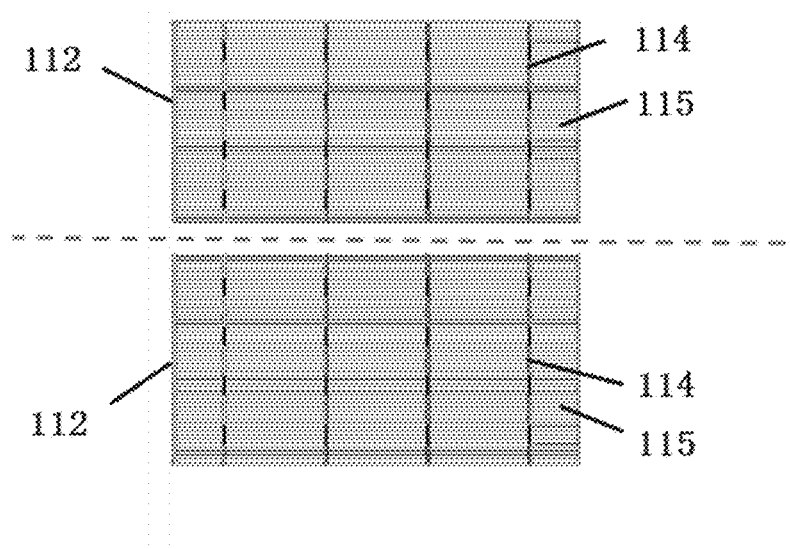
FIG. 5 is a schematic diagram of a half-cell according to a related art.

The half-cells 112 are typically obtained by cutting a whole cell into two pieces from the middle, as shown in FIG. 5. In the current process, a whole cell is typically cut along a direction perpendicular to busbars 114 to from two half-cells 112. In each obtained half-cell 112, the extension direction of each busbar 114 is parallel to the short side direction of the half-cell 112, and the extension direction of each finger 115 is parallel to the long side direction of the half-cell 112. When the half-cells 112 are applied to a half-cell assembly 100, multiple half-cells 112 in a cell string 111 are arranged along the extension directions of the busbars 114 of the half-cells 112, i.e., the second preset direction B is the short side directions of the half-cells 112.

Considering that the second preset direction B is the short side direction of the half-cell 112, the size of the half-cell 112 is larger in the first preset direction A and smaller in the second preset direction B. When configured according to a standard of 10 or 12 half-cells in each cell string 111, the cell string 111 is undersized in the second preset direction B and the multiple cell strings 111 are oversized in the first preset direction A compared to a conventional whole cell assembly.

Figure 6:
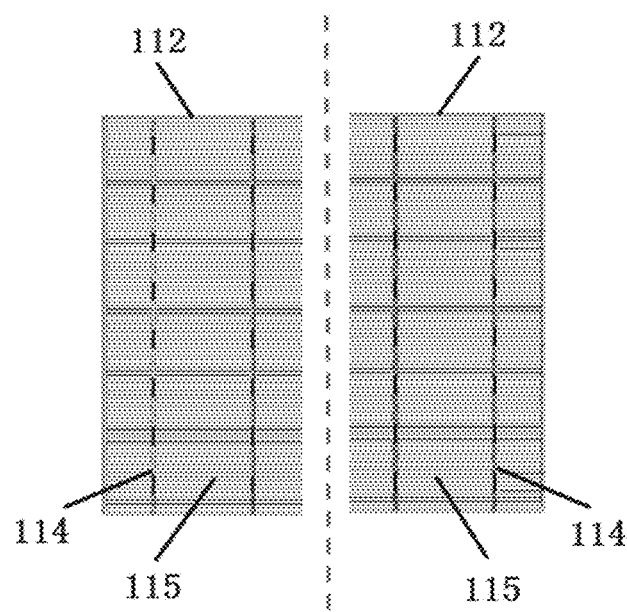
FIG. 6 is a schematic diagram of a half-cell according to an embodiment of the present disclosure.

Based on this, in some exemplary embodiments, as shown in FIG. 6, a whole cell is cut along a direction parallel to busbars 114 to form two half-cells 112. As an example, the quantity of busbars 114 in each half-cell 112 is 2 to 6, such as 2, 3, 4, 5, or 6.

In each half-cell 112 obtained by the above-mentioned cutting manner, the long side direction of the half-cell 112 is parallel to the extension directions of the busbars 114 of the half-cell 112, and the short side direction of the half-cell 112 is parallel to the fingers of the half-cell 112, i.e., the second preset direction B is the long side direction of the half-cell 112.

By using the half cells 112 with the long side directions parallel to the extension directions of the busbars 114, when configured according to a standard of 10 or 12 half-cells in each cell string 111, the size of the cell string 111 in the second preset direction B is close to that of the conventional whole cell assembly, and the size of multiple cell strings 111 in the first preset direction A is close to that of the conventional whole cell assembly. The length of the cell strings in the series connection direction and the width of the multiple parallel cell strings are consistent with conventional cell assemblies, ensuring that it is compatible with conventional production lines and operators' operations when manufacturing products.

In addition, in the above-mentioned cutting manner, laser cutting is performed after performing screen design on the whole cell, and fully enclosed half-cells 112 with no redundant grid lines at the edges can be formed. As an example, each half-cell 112 has a fully enclosed form with no redundant grid lines on the edge.

The above are only embodiments of the present disclosure and are not intended to limit the scope of protection of the present disclosure. For those skilled in the art, the present disclosure may have various changes and variations. Any modification, equivalent replacement, improvement, etc. made within the spirit and principles of the present disclosure shall be included in the scope of protection of the present disclosure.

INDUSTRIAL APPLICABILITY

The present disclosure provides a half-cell assembly, which belongs to the technical field of solar cells. The half-cell assembly includes an integrated junction box and multiple cell string sets connected in series. Each cell string set includes multiple cell strings connected in parallel, and each cell string includes multiple half-cells connected in series sequentially. The multiple cell string sets are arranged along a first preset direction. In each cell string set, the multiple cell strings are arranged along the first preset direction. In each cell string, the multiple half-cells are arranged along a second preset direction. One of the first preset direction and the second preset direction is the long side direction of the half-cell, and the other is the short side direction of the half-cell. The integrated junction box and the multiple cell string sets are arranged along the second preset direction. The multiple cell string sets are connected in parallel with the diodes of the integrated junction box. The half-cell assembly uses the integrated junction box to connect with the circuit of the half-cell, which can integrate more functions at a low cost.

In addition, it should be understood that the half-cell assembly of the present disclosure is reproducible and can be applied to various industrial applications. For example, the half-cell assembly of the present disclosure can be applied to the field of solar cells.

What is claimed is:

1. A half-cell assembly, comprising:
multiple cell string sets connected in series sequentially, each cell string set comprising multiple cell strings connected in parallel, and each cell string comprising multiple half-cells connected in series sequentially;
the multiple cell string sets being arranged along a first preset direction;
in each cell string set, the multiple cell strings being arranged along the first preset direction; in each cell string, the multiple half-cells being arranged along a second preset direction;
one of the first preset direction and the second preset direction being a long side direction of the half-cell, and the other is a short side direction of the half-cell; and
an integrated junction box, wherein the integrated junction box and the multiple cell string sets are arranged along the second preset direction, and the multiple cell string sets are connected in parallel with diodes of the integrated junction box, respectively,
wherein the integrated junction box further comprises a power supply module, a sampling module, a control module, a driving module, a control switch, and a switching diode;
wherein the diode, the power supply module and the sampling module are connected in parallel, and the diode, the power supply module and the sampling module are connected with the control switch and the sampling module in series, respectively;
an input end of the control module is electrically connected to the sampling module, an output end of the control module is electrically connected to the driving module, and the driving module is electrically connected to the control switch, so that the control module is capable of controlling the driving module to turn on and turn off the control switch according to signals from the sampling module.

2. The half-cell assembly according to claim 1, wherein the first preset direction and the second preset direction are perpendicular to each other.

3. The half-cell assembly according to claim 1, wherein a quantity of the diodes in the integrated junction box is M, M is an integer greater than or equal to 3, and the M diodes are arranged along the first preset direction;

wherein the multiple cell string sets are divided into M cell string units in a series connection direction of the multiple cell string sets;

wherein the M diodes and the M cell string units are in sequential one-to-one correspondence in the series connection direction, and each of the cell string units is sequentially connected in parallel with one of the diodes.

4. The half-cell assembly according to claim 3, wherein a quantity of the diodes in the integrated junction box is 3.

5. The half-cell assembly according to claim 3, wherein each diode comprises an anode terminal and a cathode terminal, and two ends of the corresponding cell string unit are respectively connected to the anode terminal and the cathode terminal, so as to achieve a parallel connection with the diode.

6. The half-cell assembly according to claim 3, wherein in each of the cell string units, a quantity of the cell string sets is even.

7. The half-cell assembly according to claim 1, wherein the second preset direction is the long side direction of the half-cell, and the long side direction of the half-cell is parallel to an extension direction of busbars of the half-cell.

8. The half-cell assembly according to claim 7, wherein a quantity of the busbars in each half-cell is 2 to 6.

9. The half-cell assembly according to claim 7, wherein, in each cell string, a quantity of the half-cells is 10 or 12.

10. The half-cell assembly according to claim 1, wherein, in each cell string set, a quantity of the cell strings is 2.

11. The half-cell assembly according to claim 1, wherein, in the half-cell assembly, a quantity of the cell string sets is 6.

12. The half-cell assembly according to claim 1, wherein the half-cell is a crystalline silicon cell.

13. The half-cell assembly according to claim 12, wherein the half-cell is a P-type polycrystalline silicon cell, a P-type monocrystalline silicon cell, an N-type polycrystalline silicon cell, or an N-type monocrystalline silicon cell; or the half-cell is a high-efficiency Passivated Emitter and Rear Cell, an N-type cell, a Heterojunction with Intrinsic Thin-Layer cell, or a Multi Busbar cell.

14. The half-cell assembly according to claim 3, wherein a quantity of the cell string sets is the same in different cell string units.

* * * * *